(12) United States Patent
Berman et al.

(10) Patent No.: US 6,898,064 B1
(45) Date of Patent: May 24, 2005

(54) SYSTEM AND METHOD FOR OPTIMIZING THE ELECTROSTATIC REMOVAL OF A WORKPIECE FROM A CHUCK

(75) Inventors: Michael J. Berman, Penang (MY); Rennie G. Barber, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 223 days.

(21) Appl. No.: 09/942,220

(22) Filed: Aug. 29, 2001

(51) Int. Cl.[7] .............................................. H01T 23/00
(52) U.S. Cl. ..................................... 361/234; 361/233
(58) Field of Search ................................ 361/230, 231, 361/232, 233, 234, 235; 279/128

(56) References Cited

U.S. PATENT DOCUMENTS

| | | | | |
|---|---|---|---|---|
| 5,459,632 A | * | 10/1995 | Birang et al. ................ | 361/234 |
| 5,491,603 A | * | 2/1996 | Birang et al. ................ | 361/234 |
| 5,684,669 A | * | 11/1997 | Collins et al. ............... | 361/234 |
| 5,818,682 A | * | 10/1998 | Loo ............................. | 361/234 |
| 5,848,670 A | * | 12/1998 | Salzman ...................... | 187/272 |
| 5,886,865 A | * | 3/1999 | Parkhe et al. ................ | 361/234 |
| 5,933,314 A | * | 8/1999 | Lambson et al. ............ | 361/234 |
| 6,125,025 A | * | 9/2000 | Howald et al. .............. | 361/234 |
| 6,185,085 B1 | * | 2/2001 | Hwang et al. ............... | 361/234 |
| 6,304,424 B1 | * | 10/2001 | Mett et al. ................... | 361/234 |
| 2003/0079691 A1 | * | 5/2003 | Shang et al. ................ | 118/729 |

* cited by examiner

Primary Examiner—Brian Sircus
Assistant Examiner—Danny Nguyen
(74) Attorney, Agent, or Firm—Conley Rose, P.C.

(57) ABSTRACT

A system and method are presented for neutralizing the electric charge binding a semiconductor wafer to an electrostatic chuck. When processing of a semiconductor wafer has been completed, lifter pins, driven by solenoids or pistons, are provided within the chuck to remove the wafer. However, if the electrostatic force has not been completely dissipated, the pins may have to push very hard against the wafer to dislodge it. When this occurs, the wafer may be violently displaced from the chuck, resulting in misplacement of the wafer, or even damage. A system and method are disclosed herein for completely neutralizing the electrostatic charge before removal of the wafer is attempted. Neutralization is detected as the point at which the electrostatic force opposing the lifting mechanism reaches a minimum.

16 Claims, 7 Drawing Sheets

SYSTEM AND METHOD FOR OPTIMIZING THE ELECTROSTATIC REMOVAL OF A WORKPIECE FROM A CHUCK

BACKGROUND OF THE INVENTION

1. Field of Invention

This invention relates to semiconductor manufacturing, and more particularly, to techniques for manipulating semiconductor wafers during fabrication and processing.

2. Description of Related Art

Modern semiconductor devices are typically created in large numbers on silicon wafers. A sequence of processes is performed on a wafer before it is sectioned into individual devices, which are then placed in packages with external leads or pins. Extreme precision is required in many stages of the manufacturing process, during which the wafers are generally handled by automated machinery. During critical processing steps, such as etching and implantation, the semiconductor wafer is mounted in a chuck. As defined herein, a "chuck" is any device to securely retain a wafer during a semiconductor fabrication step or steps. When these processes have been completed, the wafer must be removed and physically transported to the next manufacturing stage.

Wafers start out as circular discs of ultra-pure silicon. During the initial stages of manufacturing, the top surface of the wafer is subdivided into a matrix of small rectangular regions, each of which will become an individual integrated circuit. Then, after the many processing steps are completed, the wafer is sectioned along the boundaries of the matrix to separate the multiple integrated circuits on the wafer into "chips," or "dies."

A chuck is necessary to hold and support the wafer during semiconductor processing, and to prevent it from moving or flexing. Various manufacturing processes subject the wafer to extremely harsh conditions, such as vacuum, high temperatures, reactive gases and the application of a plasma. Throughout these processes, it is critical to maintain the position of the wafer. Originally, mechanical clamps were used to hold the wafer in the chuck during manufacturing. However, the periphery of the wafer, where it was retained by the clamps, could not be utilized. Furthermore, the use of clamps increases defects due to particles migrating from the clamps to the front side of the wafer. The clamps can also cause interactions between the areas of the wafer covered by the clamps at different layers, resulting in major defects in the wafer. Consequently, many semiconductor manufacturers have adopted the use of electrostatic chucks (ESCs), in which the attractive force between opposite electrical charges retains the wafer in the chuck. FIG. 1 illustrates the use of an ESC.

The semiconductor wafer 10 is dimensioned to fit within a circular chuck surface 12 on the top surface of the chuck 14. The chuck surface 12 can be made of an electrically-insulating material, and is typically equipped with holes 16 (or, sometimes, grooves) through which gas may be admitted to cool the wafer following a high temperature process. (Note that some processes run at higher temperatures, in which case, the gas and/or the chuck itself may be heated. In other processes, the wafer is cooled below room temperature for processing.) Lifter pins 18, which retract into the body of the chuck, are provided to raise and lower the wafer 10 onto the chuck surface 12 of the chuck. Note that the ESC allows the entire top surface of the wafer to be utilized for semiconductor fabrication.

FIG. 2 illustrates the principle of electrostatic adhesion in a mono-polar ESC. In this arrangement, the semiconductor wafer 10 is grounded, while the chuck surface 12 is connected to a DC voltage source 20. Within the chuck surface 12 is a single electrode 22, creating a region of positive charge 24 within the chuck surface 12. The formation of a charged region is possible due to the fact that the chuck surface is essentially non-conductive. Therefore, it is capable of accumulating an electric charge and of supporting a voltage gradient (i.e., a voltage difference can exist between two different points within the chuck surface). The wafer 10 is also non-conductive, and since the voltage source is ground-referenced, an oppositely-charged region 26 forms in the wafer. This establishes an attractive force between the wafer and the chuck surface, which binds the wafer in the chuck.

An alternative to the mono-polar chuck is the bi-polar ESC, shown in FIG. 3. The physical relationship of the wafer 10 to the chuck surface 12 of the chuck is the same as in the mono-polar ESC shown in FIG. 2. In this case, however, a pair of voltage sources 30a and 30b with opposite polarities are connected to two electrodes 32a and 32b. This arrangement creates separate positively charged 34a and negatively charged 34b regions within the chuck surface 12. The oppositely-charged regions within the chuck induce a complementary polarization within the wafer, forming a negatively-charged region 36a and positively-charged region 36b. As in the case of the mono-polar ESC, an electrostatic force attracts the wafer 10 to the chuck surface 12 of the chuck.

A problem exists with present electrostatic chucks, however. At the point in the process of manufacturing a wafer, when the procedures requiring extreme temperatures and pressures have been concluded, it is necessary to remove the wafer from the chuck. Before this can be done, however, it is necessary to remove the charge holding the wafer to the chuck. This is accomplished by applying a charge of opposite polarity to neutralize the existing charge. Once the electrostatic attractive force has been eliminated, the lifter pins (item 18 in FIG. 1) can raise the wafer off the chuck surface of the chuck, allowing it to be removed (typically, by a robotic arm) from the processing equipment. Neutralization of the accumulated electrical charge on the chuck and wafer is typically accomplished by reversing the polarity of the voltage source(s) for a prescribed time interval. But because of variations in the electrical properties of the wafer and the chuck surface, the length of time required for the accumulated charge to be neutralized is inconsistent and unpredictable.

Most semiconductor processing systems simply assign a fixed time for ESC charge neutralization. This is not a satisfactory solution, however. If the neutralization time is too short, a residual charge will remain to oppose removal of the wafer. If the neutralization time is too long, a reverse electrical charge may be induced in the wafer and chuck, reestablishing the attractive force. In either case, the lifter pins may attempt to remove the wafer while it is still attracted to the chuck surface of the chuck. This can cause the wafer to be violently ejected from the chuck, disrupting the manufacturing process and possibly damaging the wafer.

SUMMARY OF THE INVENTION

The problems outlined above are addressed by a system and method for monitoring the force applied to a semiconductor wafer by the lifter pins in an electrostatic chuck (hereinafter "chuck"). When the lifter pins are engaged to remove the wafer from the chuck (following processing of the wafer during manufacturing), the amount of force being exerted on the wafer is sensed, and used to develop a feedback signal. Force feedback can be utilized by the lifter pin control mechanism to prevent the application of excessive force against the wafer, and by the electrostatic control system to determine the point at which the charge attracting the wafer to the chuck has been completely neutralized.

A system is presented for retaining a silicon wafer in an electrostatic chuck during processing, and subsequently releasing the wafer from the chuck. The chuck is equipped with lifter pins, which may be driven by a solenoid or a pressure-actuated piston. When it is necessary to remove the wafer from the chuck, a control system applies a moderate force to the lifter pins. The polarity of the voltage source used to impart the electric charge attracting the wafer to the chuck is then reversed, dissipating the attractive charge. While the charge diminishes, the electrostatic attractive force opposing the lifter pins is monitored, until it reaches a minimum value. When the minimum is attained, the voltage source is turned off and full force is applied to the lifter pins, raising the wafer off the chuck.

Various techniques may be employed to estimate the residual electrostatic force needed to raise the wafer. In one embodiment, load cells directly measure the force opposing the lifter pins. In a second embodiment, the current to the solenoids driving the lifter pins is measured. Since the current in a solenoid is proportional to the force it exerts, the opposing electrostatic force can be indirectly measured in this manner. In a third embodiment, the lifter pins are driven by a hydraulic or pneumatic piston. In this case, the control system regulates the pressure to the piston to control the force applied by lifter pins. A pressure sensor in the hydraulic or pneumatic line to the piston measures the force applied by the lifter pins. In a fourth embodiment, an orifice at the interface between the wafer and the chuck surface of the chuck is connected to a sensing line. The presence or absence of pressure in the sensing line is used to indicate the point at which the moderate force exerted by the lifter pins is sufficient to overcome the remaining electrostatic attraction between the wafer and the chuck.

A method is also presented for retaining a silicon wafer in an electrostatic chuck during processing, and subsequently releasing the wafer from the chuck. The method calls for reversing the polarity of the voltage source used to impart the attractive charge to the wafer and chuck, thus dissipating this charge and reducing the attractive force. The method further discloses exerting a moderate force against the wafer, by means of lifter pins within the chuck, while the reverse polarity voltage source is applied. According to the method, while the residual charge in the wafer and chuck decreases, the electrostatic attractive force is monitored until it reaches a minimum value. At this point, the charge has been completely neutralized, and the lifter pins are fully engaged to remove the wafer from the chuck.

BRIEF DESCRIPTION OF THE DRAWINGS

Other objects and advantages of the invention will become apparent upon reading the following detailed description and upon reference to the accompanying drawings in which.

Figure 1:
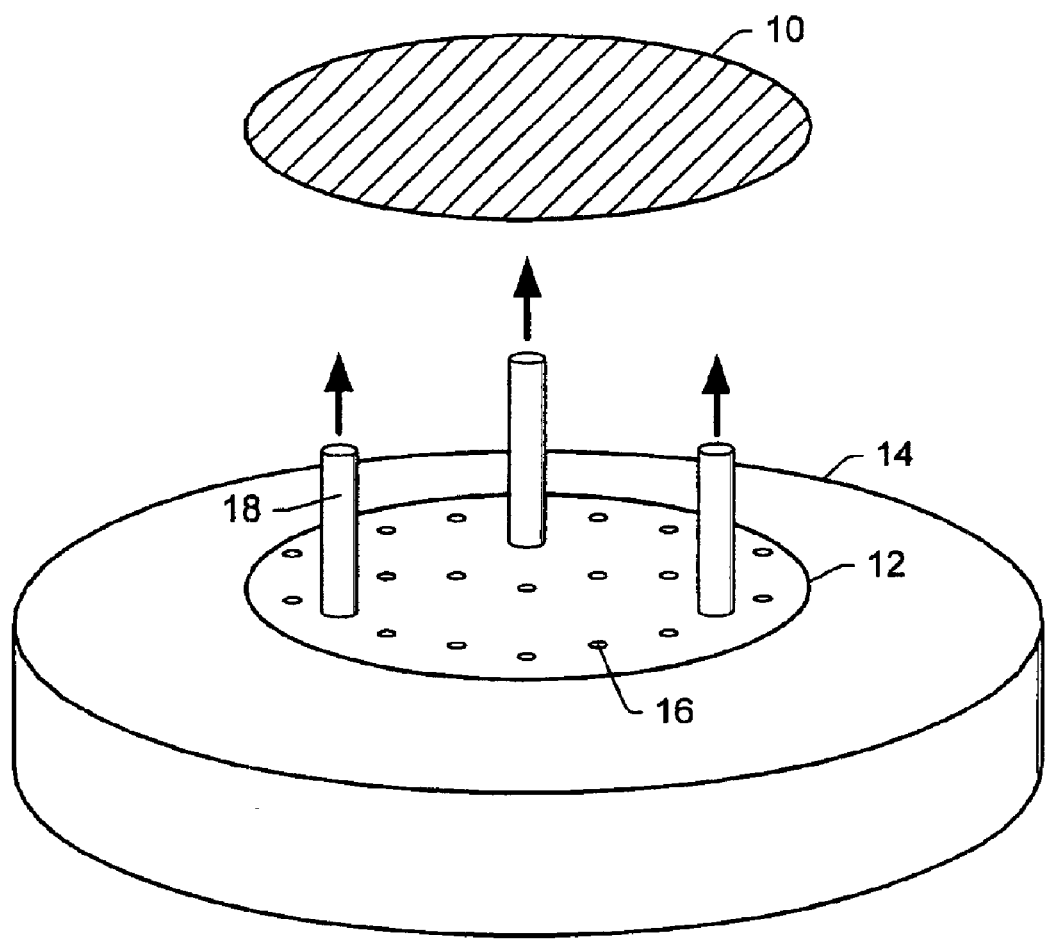
FIG. 1 illustrates a typical electrostatic chuck (ESC) and semiconductor wafer.
Figure 2:
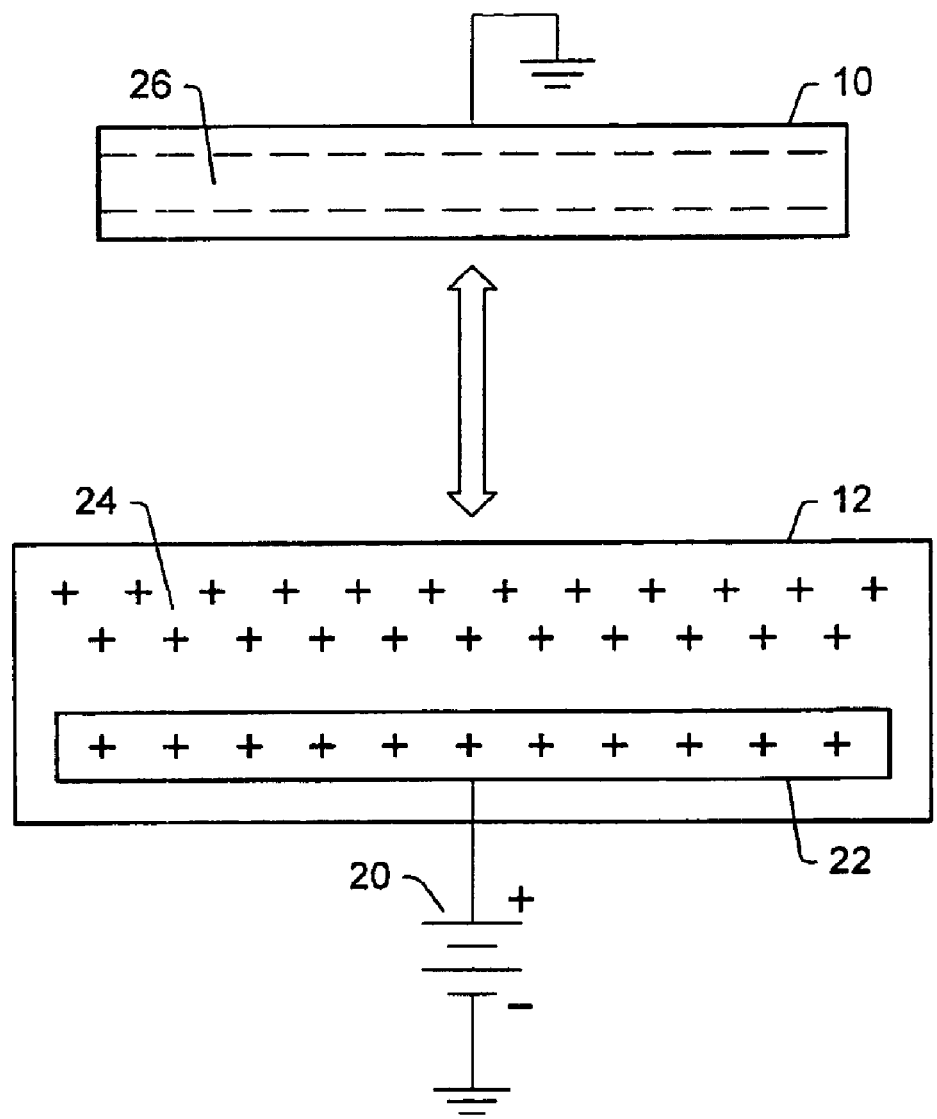
FIG. 2 is a schematic representation of a mono-polar ESC.
Figure 3:
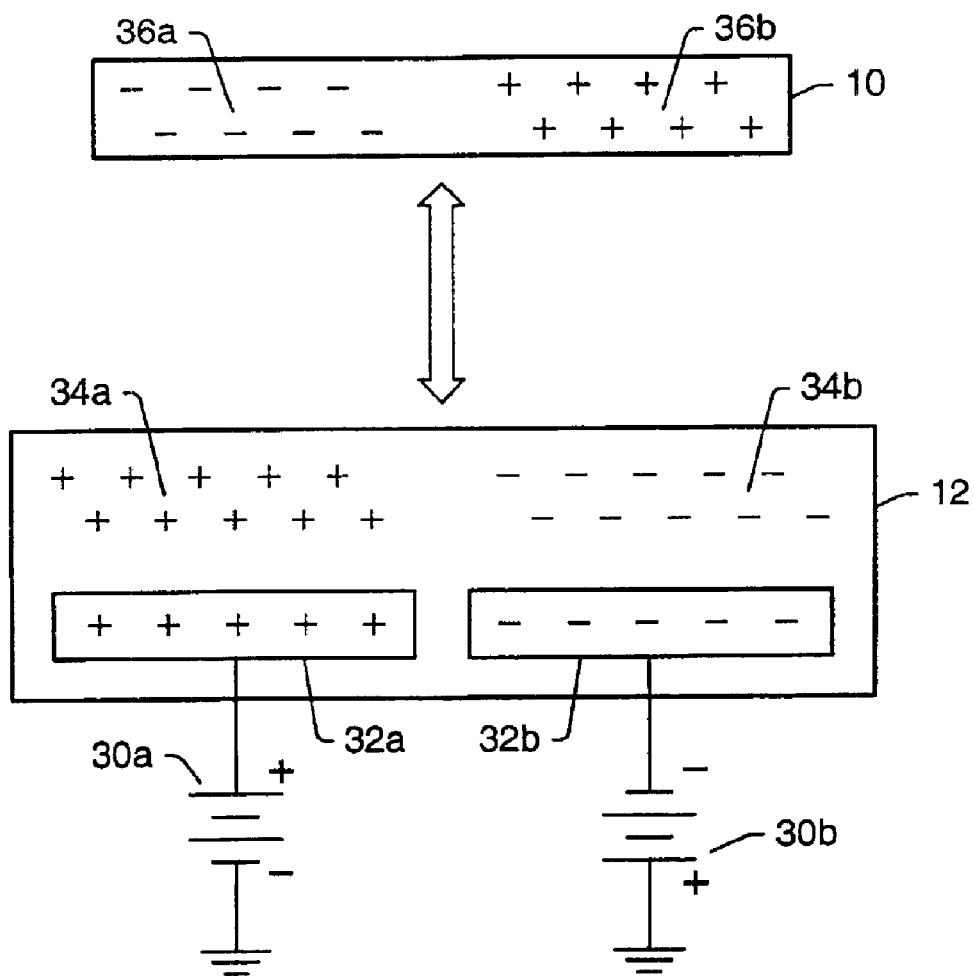
FIG. 3 is a schematic representation of a bi-polar ESC.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

A system and method are presented whereby substantially complete neutralization of an electrical charge between a semiconductor wafer and an electrostatic chuck (hereinafter "chuck") may be achieved, by monitoring the attractive force between the wafer and the chuck. Present systems are based on a fixed estimate of the length of time required to neutralize the electric charge holding the wafer in the chuck. However, if this estimate is incorrect, complete neutralization may not occur. A substantial attractive force may then remain, making removal of the wafer problematic. If the attractive force is not completely neutralized before the lifter pins attempt to remove the wafer, the wafer may be suddenly and violently ejected from the chuck surface. This can result in a major loss of tool time (the semiconductor fabrication system may be down for several hours), while a dropped or broken wafer is retrieved, and the tool is cleaned and prepared for use again. Furthermore, defects in the wafer can also damage the tool or harm other wafers being processed. The loss of a wafer is very costly, since a broken or scrapped wafer may represent a substantial loss in sales. A chipped wafer that breaks at a later stage in the manufacturing process (e.g., at the point where the wafer is sectioned into individual semiconductor chips) may result in even greater financial loss—since the further down the process, the more valuable the wafers are. In such cases, it is also much harder to identify the root cause of the breakage.

The system and method disclosed herein are believed to overcome such problems by monitoring the attractive force between the wafer and the chuck. The electrostatic charge between the wafer and the chuck is assumed to be completely neutralized when this force reaches a minimum value. Once the charge has been neutralized, the wafer may safely be removed through the use of lifter pins within the chuck. Advantageously, the ability to ascertain complete charge neutralization also allows optimizes wafer processing throughput, since it avoids a longer-than-necessary wait for full depletion the residual electrostatic charge on the chuck.

Figure 4:
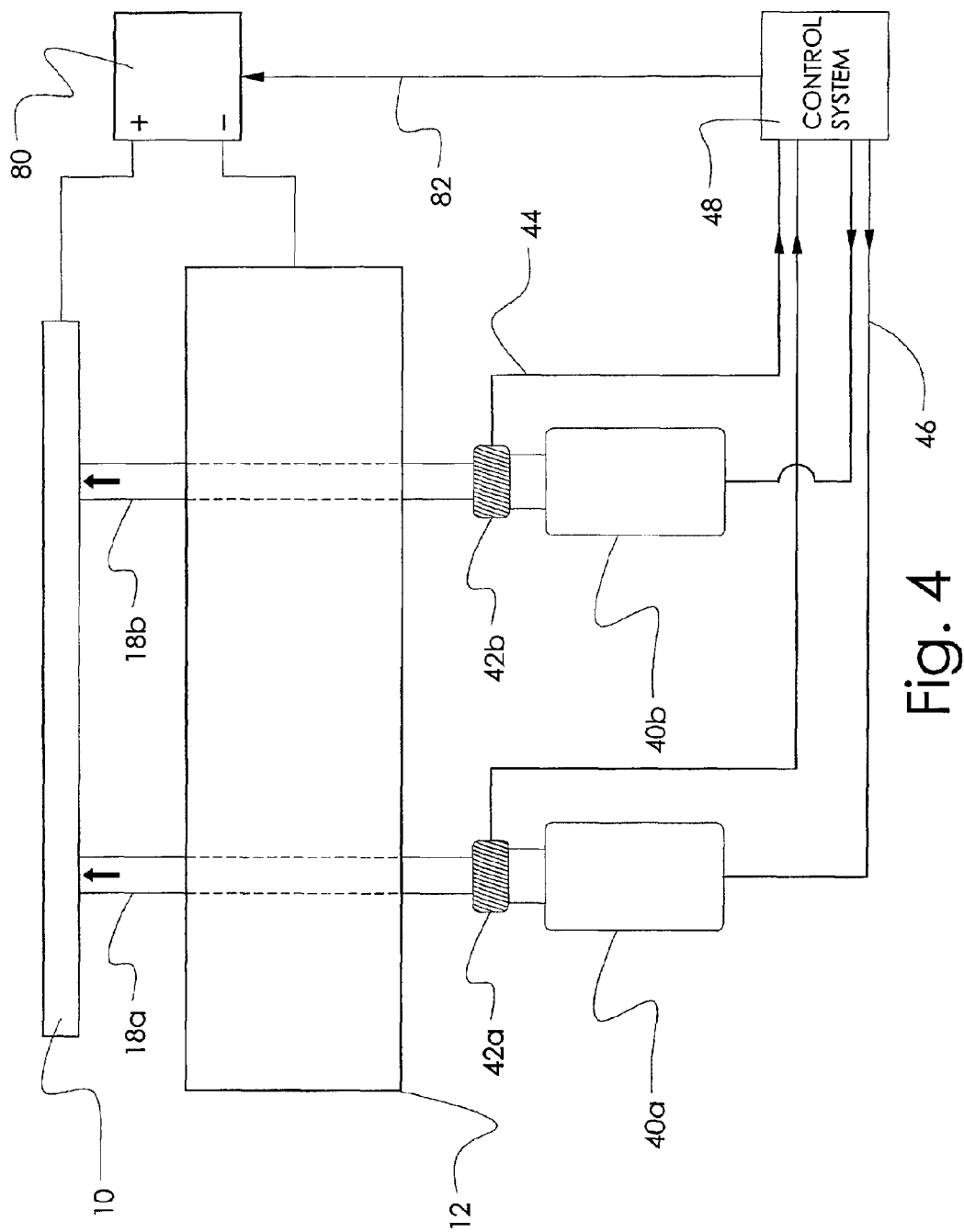
FIG. 4 illustrates a first embodiment of the system and method presented.

In a first embodiment of the system and method, shown in FIG. 4, electromechanical devices 40a and 40b (e.g., solenoids) are used to extend the lifter pins 18a and 18b, which raise the wafer 10 off the chuck surface 12. Sensors 42a and 42b (e.g., load cells) generate a signal 44 proportional to the force exerted on them by the lifter pins. While the wafer is retained in the chuck, the sensors register the force exerted by the pins against the wafer. The proportional signal 44 may be relayed back to a control system 48, which modulates the current 46 to the electromechanical devices to limit the applied lifting force. The control system 48 also has the capability to program the voltage source(s) 80 used to induce and neutralize the electrostatic charge on the wafer and chuck. The magnitude and polarity of the voltage source 80 are programmed using a control interface 82.

When processing of the wafer is completed, the control system 48 initially applies a reduced current to the solenoids 40a and 40b, causing lifter pins 18a and 18b to exert a weak lifting force against the wafer 10. At the same time, a reverse polarity voltage is applied to the wafer and chuck by voltage source 80, to neutralize their electrostatic charge. As the reverse polarity voltage gradually neutralizes the charge, the attractive force opposing the lifter pins diminishes. At some point, the force approaches a predefined minimum value. The control system 48 then terminates the reverse polarity voltage, and applies full current to the lifter pins, causing them the raise the wafer off the chuck surface. The predefined minimum value can be programmed as that which is sensed on sensors 42. Once the predefined minimum value is sensed, the sensors 42 send an appropriate signal to control system 48.

Figure 5:
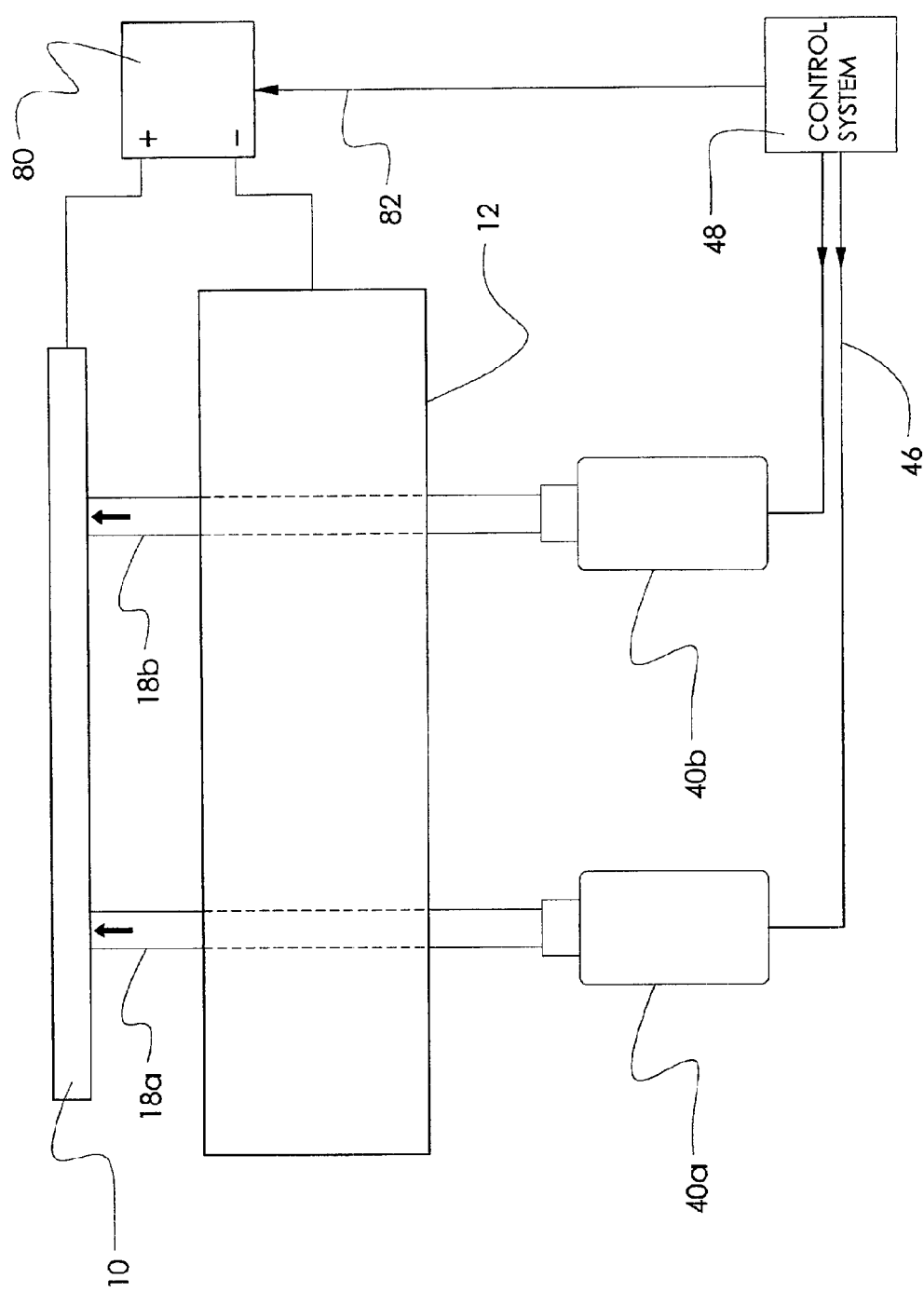
FIG. 5 illustrates a second embodiment of the system and method presented.

A second embodiment of the present system and method shown in FIG. 5, does not use load cells (or similar force sensors). Since the force applied by a solenoid is proportional to the solenoid current, the magnitude of the electrostatic force opposing the lifter pins may be determined without the use of a dedicated sensor, by simply monitoring the current 46 in the solenoids 40a and 40b. The procedure for removing a wafer is similar to that described above. A moderate current is supplied to the solenoids, causing the lifter pins to exert a light force against the wafer. At the same time, the control system 48 programs 82 the voltage source 80 to apply a reverse polarity voltage 80 to neutralize the charge binding the wafer to the chuck. When the charge has been completely neutralized, the force opposing the pins reaches a minimum. This corresponds to a minimum value of solenoid current, which is sensed by the control system 48. When the minimum current is reached, the control system terminates the reverse polarity voltage and applies full current to the solenoids to lift the wafer off the chuck.

Figure 6:
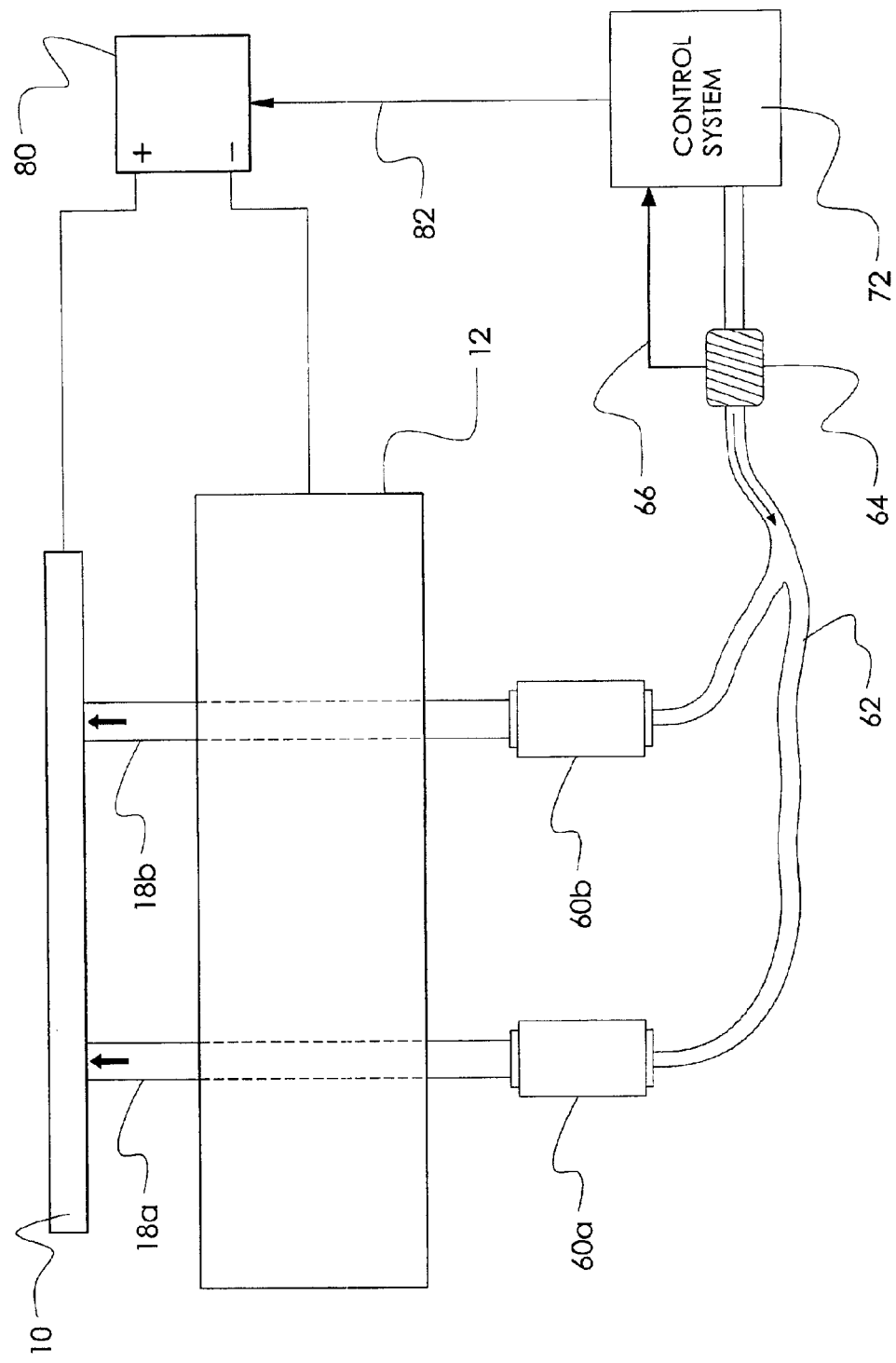
FIG. 6 illustrates a third embodiment of the system and method presented.

A third embodiment of the present system and method is shown in FIG. 6. In this case, the lifter pins 18a and 18b are driven by pneumatic or hydraulic pressure-actuated pistons 60a and 60b, rather than solenoids or other electromechanical devices. The pistons are coupled to a pressure line 62, which is controlled by a control system 72. The control system 72 programs the voltage source 80 that charges the wafer and chuck, using a control interface 82. A pressure sensor 64 generates a signal 66 proportional to the pressure in line 62, which is proportional to the force exerted by lifter pins 18a and 18b against the wafer 10. As before, when the wafer is to be removed, the control system applies a low pressure in line 62, exerting a weak lifting force against the wafer. At the same time, a reverse polarity is applied by the voltage source 80 to neutralize the charge in the wafer and chuck and reduce the attractive force between them. When the signal 66 received by the control system 72 from sensor 64 indicates that the line pressure has reached a minimum value, the neutralizing voltage is terminated and full pressure is applied to the lifter pins, raising the wafer off the chuck.

Figure 7:
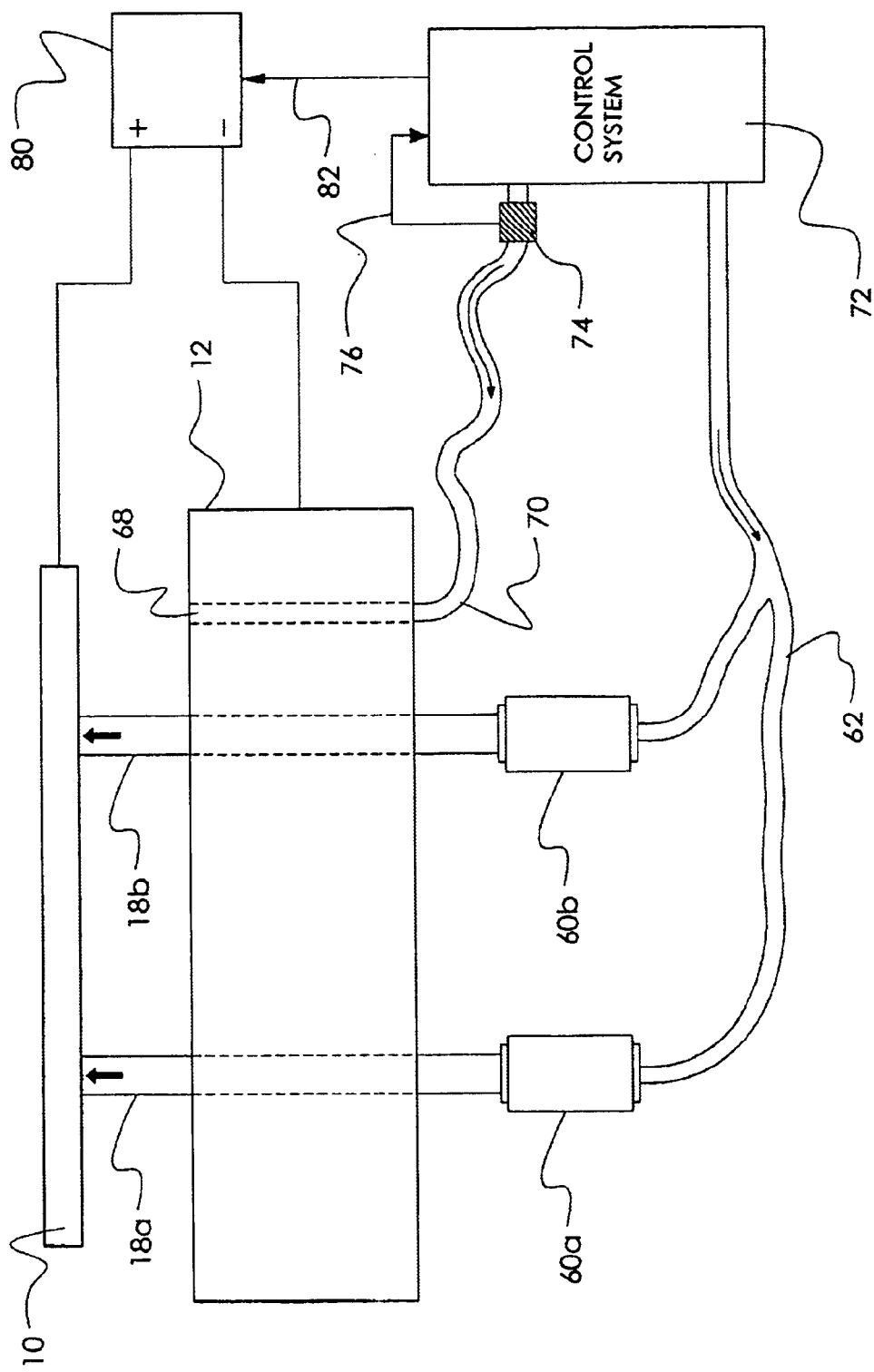
FIG. 7 illustrates a fourth embodiment of the system and method presented.

A fourth embodiment of the present system and method, illustrated in FIG. 7, employs a small orifice 68 in the surface of the chuck 12 to monitor the pressure delivered against the wafer via a sensing line 70. In this embodiment, a pressure sensor 74 (similar to 64) may be situated at a convenient location along the sensing line 70.

Rather than measuring the pressure of the wafer on sensors or on the moveable pins, this sensor may simply indicate the presence or absence of pressure at the surface of the chuck. A signal 76 generated by the sensor is provided to the control system 72. To remove the wafer, the control system applies a low pressure to the pistons 60a and 60b, resulting in a weak lifting force exerted against the wafer. At the same time, the control system 72 programs 82 the voltage source 80 to apply a reverse polarity voltage to the wafer and chuck, to dissipate the previously accumulated charge and gradually reduce the attractive force. As long as the residual electrostatic force exceeds the force exerted by the lifter pins, the wafer remains bound to the chuck surface of the chuck. In these circumstances, the orifice 68 is covered by the wafer 10, so there is pressure in sensing line 70. As the residual charge is neutralized however, the electrostatic attraction will eventually diminish until it is overcome by the weak force exerted by the lifter pins. At this point, the absence of pressure in sensing line 70 causes the sensor 74 to signal the control system. The control system then terminates the reverse polarity voltage and engages full pressure to the lifter pins, to raise the wafer off the chuck.

It is believed that the system and method disclosed herein offer significant advantages for the use of an electrostatic chuck in semiconductor wafer processing. By precisely terminating the charge neutralization, it is possible to avoid excessive residual charge on the wafer and chuck. This prevents problems that can result when the wafer is abruptly dislocated from the chuck, as often occurs when lifter pins suddenly overcome a residual attractive force between the wafer and chuck.

It will be appreciated by those skilled in the art having the benefit of this disclosure that this invention is believed to present a method for determining neutralization of the charge in a semiconductor wafer and electrostatic chuck. Further modifications and alternative embodiments of various aspects of the invention will be apparent to those skilled in the art in view of this description. Details described herein, such as the type of pressure sensor, are exemplary of a particular embodiment. It is intended that the following claims be interpreted to embrace all such modifications and changes and, accordingly, the specification and drawings are to be regarded in an illustrative rather than a restrictive sense.

What is claimed is:

1. A system for retaining a silicon wafer during semiconductor processing and subsequently releasing it, the system comprising:

a chuck equipped with a lifting mechanism that comprises at least one extendable lifting pin driven by a solenoid, and wherein current from the solenoid is a measured current, wherein the chuck is dimensioned to receive the wafer and the lifting mechanism is adapted to release the wafer from the chuck;

a voltage source operably coupled to the chuck, and adapted to impart an electric charge to the chuck and an opposite electric charge to the wafer, producing an electrostatic attraction between the wafer and the chuck;

a sensor adapted to measure a force due to the electrostatic attraction, wherein said force is in opposition to an applied forced provided by the lifting mechanism, and wherein the sensor comprises a current monitor adapted for measuring the current from the solenoid, wherein the measured current is proportional to the applied lifting force; and a control system adapted to receive the measured current and neutralize the electrostatic attraction between the wafer and the chuck by reversing a polarity of the voltage source, thereby reducing the electric charge to the chuck and the opposite electric charge to the wafer until the force due to the electrostatic attraction reaches a predetermined minimum, as indicated by the sensor.

2. The system as recited in claim 1, wherein the sensor comprises a load cell adapted to measure the force opposing the lifting mechanism and to forward the measured force to the control system.

3. The system as recited in claim 1, wherein the control system is further adapted to limit the current to the solenoid until the force opposing the lifting mechanism reaches a predefined minimum, and then to increase the current to the solenoid to enable the lifting mechanism to raise the wafer off the chuck.

4. The system as recited in claim 1, wherein the sensor comprises a pressure sensor adapted to measure a pressure equivalent to force opposing the lifting mechanism and to forward the measured pressure to the control system.

5. The system as recited in claim 4, wherein the control system is further adapted to limit the pressure to the piston until the pressure opposing the extensible lifting pin reaches a minimum, and then to increase the pressure to the piston to enable the lifting mechanism to raise the wafer off the chuck.

6. The system as recited in claim 1, wherein the sensor comprises an orifice at an interface between the wafer and the chuck, operably coupled to the chuck are:

a line through which pressure may be applied to the wafer through the orifice; and a sensor adapted to indicate to the control system the presence or absence of pressure at the orifice.

7. The system as recited in claim 6, wherein the control system is further adapted to limit the pressure to the piston until the pressure at the orifice is absent, and then to increase the pressure to the piston to enable the lifting mechanism to raise the wafer off the chuck.

8. A method for releasing a semiconductor wafer, comprising:

sensing electrostatic attraction between a wafer and a chuck electrically charged opposite one another;

measuring a current proportional to an applied lifting force;

neutralizing the electrostatic attraction by reversing the electrical charge applied to the wafer and the chuck; and when the sensed electrostatic attraction achieves a pre-determined minimum, lifting the wafer from the chuck by driving a solenoid coupled to an extendable pin and extending the pin against a backside of the wafer, and wherein said measuring comprises determining the current in the solenoid needed to oppose a downward force of the wafer against the extendable pin prior to lifting the wafer.

9. The method as recited in claim 8, further comprising:

placing the wafer on the chuck; and charging the wafer and chuck opposite one another.

10. The method as recited in claim 8, wherein said sensing comprises reading a pressure of the pin against the backside of the wafer prior to lifting the wafer.

11. The method as recited in claim 8, further comprising limiting the current until the force of the wafer reaches a minimum, and then increasing the current to enable lifting the wafer.

12. The method as recited in claim 8, wherein said lifting comprises pneumatically driving a pressure-actuated piston bearing against a backside of the wafer.

13. The method as recited in claim 12, wherein said sensing comprises sensing the pressure within the pressure-actuated piston during times when the piston bears against the backside of the wafer.

14. The method as recited in claim 13, further comprising limiting the pressure within the pressure-actuated pistons until the pressure brought to bear against the pistons reaches a pre-determined minimum, and then increasing the to the pistons to enable lifting the wafer.

15. The method as recited in claim 12, further comprising reading a pressure at an orifice configured at the interface between the wafer and the chuck.

16. The method as recited in claim 12, further comprising limiting the pressure to the piston until the pressure at the orifice is absent, and then increasing the pressure to enabling lifting the wafer.

* * * * *